(12) United States Patent
Terzioglu et al.

(10) Patent No.: US 7,508,694 B2
(45) Date of Patent: Mar. 24, 2009

(54) ONE-TIME-PROGRAMMABLE MEMORY

(75) Inventors: Esin Terzioglu, Aliso Viejo, CA (US);
Gil I. Winograd, Aliso Viejo, CA (US);
Morteza Cyrus Afghahi, Coto De Caza, CA (US)

(73) Assignee: Novelics, LLC, Aliso Viejo, CA (US)

( * ) Notice: Subject to any disclaimer, the term of this patent is extended or adjusted under 35 U.S.C. 154(b) by 17 days.

(21) Appl. No.: 11/747,390

(22) Filed: May 11, 2007

(65) Prior Publication Data
US 2008/0074915 A1 Mar. 27, 2008

Related U.S. Application Data

(60) Provisional application No. 60/863,043, filed on Oct. 26, 2006, provisional application No. 60/827,192, filed on Sep. 27, 2006.

(51) Int. Cl.
*G11C 17/16* (2006.01)
(52) U.S. Cl. ................ 365/96; 365/225.7
(58) Field of Classification Search ............ 365/96
See application file for complete search history.

(56) References Cited

U.S. PATENT DOCUMENTS

| | | | |
|---|---|---|---|
| 5,191,550 A * | 3/1993 | Kubota | 365/96 |
| 5,793,224 A | 8/1998 | Sher | |
| 5,818,749 A | 10/1998 | Harshfield | |
| 5,953,255 A * | 9/1999 | Lee | 365/185.29 |
| 7,102,951 B2 | 9/2006 | Paillet et al. | |
| 7,339,848 B1 * | 3/2008 | Stansell et al. | 365/225.7 |
| 2004/0100850 A1 | 5/2004 | Novosel | |
| 2004/0257859 A1 | 12/2004 | Smith et al. | |
| 2005/0101088 A1 | 5/2005 | Scheuerlein et al. | |
| 2005/0111257 A1 | 5/2005 | Eitan | |
| 2006/0067152 A1 | 3/2006 | Keshavarzi et al. | |

OTHER PUBLICATIONS

PCT Search Report for PCT/US07/79452, Mar. 10, 2008, Novelics LLC.

* cited by examiner

*Primary Examiner*—Tan T. Nguyen
(74) *Attorney, Agent, or Firm*—Jonathan W. Hallman; MacPherson Kwok Chen & Heid LLP

(57) ABSTRACT

A one-time-programmable memory cell uses two complementary antifuses that are programmed in a complementary fashion such that only one of the two complementary antifuses is stressed by a programming voltage. The programming voltage stress one a particular one of the complementary antifuses indicates a logical state of the memory cell. For example, a logical high state may correspond to a first one of the complementary antifuses being stressed whereas a logical low state may correspond to the stressing of the remaining one of the complementary antifuses.

20 Claims, 4 Drawing Sheets

ONE-TIME-PROGRAMMABLE MEMORY

RELATED APPLICATION

This application claims the benefit of U.S. Provisional Application No. 60/863,043, filed Oct. 26, 2006. In addition, this application claims the benefit of U.S. Provisional Application No. 60/827,192, filed Sep. 27, 2006.

TECHNICAL FIELD

The present invention relates to memory circuits, and more particularly to one-time-programmable memories.

BACKGROUND

One-time programmable (OTP) memories having antifuse memory cells are programmed using voltage or current pulses. Each antifuse memory cell contains an insulator such as a gate oxide that is supplied in a high-impedance (non-conducting) state. Upon application of a programming pulse, the insulator breaks down such that it is irreversibly transformed into a low-impedance (conducting) state. As compared to other types of OTP memories such as the charge storage approach used in OTP flash, antifuses are more reliable in that charge leakage will occur over time in OTP flash. This charge leakage is exacerbated as circuit dimensions are made ever smaller with the advance of semiconductor manufacturing technology.

Although antifuse memories do not suffer from flash charge leakage, reliability problems exist with these memories as well. For example, as circuit dimensions continue to shrink, the insulator in the antifuse memory cells such as gate oxide has its thickness reduced correspondingly such that electrons may quantum mechanically tunnel through the insulating layer. Because electrons are tunneling rather than conducting through the insulating layer, "burning" the insulating layer so as to program antifuse memory cells becomes increasingly difficult. Thus, users of antifuse memory cells encounter increased difficulties with reliably breaking down the insulating layer to a predictable conductivity. Moreover, even un-programmed antifuse memory cells can conduct appreciable leakage currents such that leaky un-programmed antifuse cells are incorrectly detected as having been programmed to a conducting state.

Accordingly, there is a need in the art for antifuse memory cells having improved reliability.

SUMMARY

This section summarizes some features of the invention. Other features are described in the subsequent sections.

In accordance with a first aspect of the invention, a one-time-programmable (OTP) memory cell is provided that includes: a pair of antifuses, and a programming voltage access device adapted to provide a programming voltage to a first terminal for each antifuse in the pair, wherein the pair of antifuses have opposing second terminals that are adapted to couple to bit lines such that only a selected one of the antifuses in the pair is stressed by the programming voltage, a remaining one of the antifuses in the pair thereby being unstressed by the programming voltage.

In accordance with another aspect of the invention, a method of programming a one-time-programmable (OTP) memory cell having a pair of complementary antifuses is provided that comprises: representing a first logical state by stressing a first one of the complementary antifuses while leaving a remaining second one of the complementary antifuses unstressed; and representing a second logical state by stressing the second one of the complementary antifuses while leaving the remaining first one of the complementary antifuses unstressed.

In accordance with another aspect of the invention, an array of memory cells arranged into rows and columns is provided. The array comprises: a plurality of bit line pairs corresponding to the columns, each bit line pair including a bit line and a complementary bit line; a memory cell at each row and column intersection such that each memory cell corresponds uniquely to a row and a column, each memory cell having a pair of complementary antifuses, a first antifuse in the complementary pair of antifuses having a terminal directly coupled to the bit line in the corresponding column and a remaining second antifuse in the complementary pair of antifuses having a first terminal directly coupled to the complementary bit in the corresponding column; and an access device corresponding to each memory cell, each access device directly coupling to an opposing second terminal for each antifuse in the corresponding memory cell, the access device controlling whether the opposing second terminals are coupled to a programming voltage signal.

In accordance with another aspect of the invention, a memory array is provided, comprising: a plurality of antifuses transistors, each antifuse transistor having a pair of drain/source regions and a gate overlapping the drain/source regions, the gate being separated from the drain/source regions by an insulating layer, wherein each drain/source region couples to an access device such that a programming voltage may be applied to a selected one of the drain/source regions to stress a portion of the insulating layer while a remaining portion of the insulating layer that separates a remaining one of the source/drain regions is not stressed.

In accordance with another aspect of the invention, a method of programming an OTP memory is provided that comprises: affecting the threshold voltage of a short channel transistor using hot electrons to represent a logical state.

The invention is not limited to the features and advantages described above. Other features are described below. The invention is defined by the appended claims.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Figure 1:
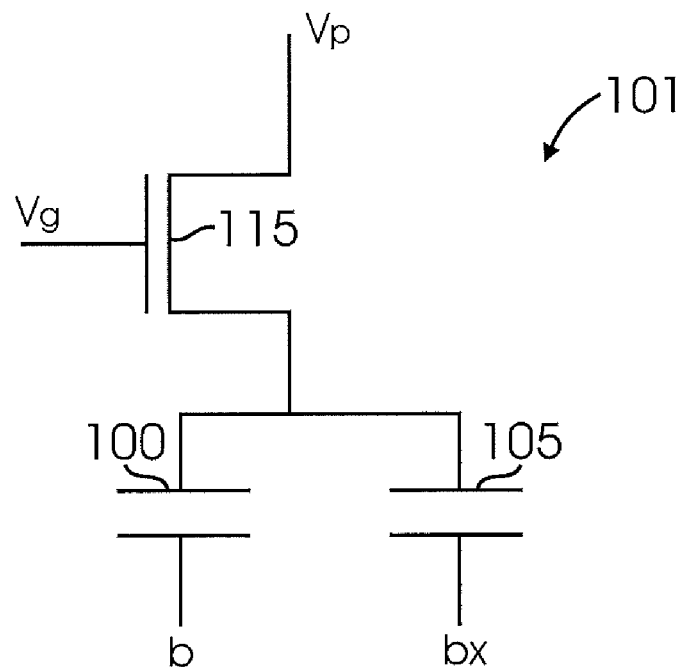
FIG. 1 is a circuit diagram of a memory cell having complementary antifuses in accordance with an embodiment of the invention.

To provide a one time programmable (OTP) antifuse-based memory having improved reliability, a bit may be stored using a first antifuse capacitor 100 and a complementary antifuse capacitor 105 as shown in FIG. 1 for an OTP memory cell 101. Antifuse 100 has a terminal directly coupled to a bit line b whereas complementary antifuse 105 has a terminal directly coupled to a complementary bit line bx. Both antifuses have an opposing terminal directly coupled to a terminal of an access transistor 115. Access transistor 115 may be either a PMOS or an NMOS transistor. Access transistor 115 will conduct depending upon a voltage signal Vg applied to its gate. Should access transistor 115 be turned on in this fashion, charge from a programming line Vp will raise the potential of the opposing terminals of antifuses 100 and 115 to a programming voltage VPP. This programming voltage is of a magnitude (typically on the order of 5 to 7 volts for advanced CMOS processes) such that one of bit lines b or bx is grounded, the corresponding insulating layer in the grounded antifuse will breakdown irreversibly due to the voltage stress from programming voltage VPP being applied to the opposing terminal of the grounded antifuse. In an NMOS embodiment, the gate voltage Vg is raised to VPP to access the antifuses. In a PMOS embodiment, the gate voltage Vg is lowered to an intermediary voltage such as VPP/2 to access the antifuses. It will be appreciated that such an intermediary voltage reduces the stress on access transistor 115.

Regardless of the polarity of the memory cell, it may thus be programmed in a complementary matter such that one antifuse is broken down whereas the remaining antifuse is left intact. For example, a logic high programming state may be generated by breaking down antifuse 100 whereas antifuse 105 is left intact. Conversely, a logic low programming state may be generated by breaking down antifuse 105 whereas antifuse 100 is left intact. It will be appreciated that the denotation of whether such programming states are logic high or logic low is a design choice. As used herein, memory cell 101 will be denoted as programmed if antifuse 100 is broken down whereas memory cell 100 will be denoted as un-programmed if antifuse 105 is broken down. Regardless of whether a cell is programmed or un-programmed, one antifuse is broken down and the remaining antifuse is left intact.

Consider the advantages of memory cell 101 with respect to reliability and robustness of operation: if quantum mechanical tunneling prevents an absolute breakdown of the insulating layer in any given antifuse, so long as the breakdown is such that the programmed antifuse is conducting a sufficiently higher amount of current than the non-programmed antifuse, a detector such as a sense amplifier may properly ascertain the logical state of the memory cell. Conversely, if an insulating layer in a non-programmed antifuse is slightly defective such that it is conducting a relatively substantial leakage current, so long as this leakage current is sufficiently less than that conducted by the programmed antifuse, a decoder may again make the correct decision as to the logical state of the memory cell.

Memory cell 101 may be arrayed into a one-dimensional (single row) or a two-dimensional (multiple rows and columns) memory. Each row of memory cells may have a word line that couples to the gates of access transistors 115 in the corresponding memory cells. In a one-dimensional memory, bit lines b and bx couple to only one memory cell. However, in a two-dimensional memory, these bit lines will couple across multiple rows and hence across multiple memory cells. Each bit line b/bx pair and the corresponding memory cells may be denoted as a column in such an array. Given a two-dimensional memory array, it may be seen that there are at least four different states resulting from the selection of a particular row and column such that a particular memory cell is addressed. The selected memory cell may be considered to constitute a first programming state. This selection means that one of the corresponding bit lines (b or bx) will be grounded such that the appropriate antifuse is broken down because the corresponding access transistor is conducting such that the programming voltage VPP from the programming line will be applied across the insulating layer of the antifuse that has its bit line terminal grounded. Unselected memory cells in a selected row (meaning assertion of the word line such that the access transistors in the selected row are conducting) may be considered to constitute a second programming state. Conversely, memory cells in an unselected row (which may also be denoted as an inactive row) but coupled to a selected bit line pair (which may also be denoted as an active bit line pair or column) may be considered to constitute a third programming state. Finally, memory cells in inactive rows and columns constitute a fourth programming state.

Given these four programming states, representative programming voltages to program a given memory cell may now be discussed. As discussed above, a programmed cell as used herein denotes a memory cell in which antifuse 100 is broken down (conducting) whereas antifuse 105 is left intact (non-conducting). In a one-dimensional memory, bit line bx may simply have its potential raised to the programming voltage VPP to prevent any stress on antifuse 105 for a programmed memory cell. However, in a two-dimensional memory, this programming voltage would then potentially stress other antifuses 105 in inactive rows. To prevent this stress, bit line bx in the active column may have its potential brought to some intermediary voltage (such as, for example, VPP/2). Similarly, the programming line voltage for inactive columns in an active row may also be charged to an intermediary voltage to minimize the stress on the access transistors corresponding to the inactive columns. Moreover, the gate voltage Vg for the inactive rows may also be charged to VPP/2 (or some other suitable intermediary voltage). Finally, the bit lines in the inactive columns may be allowed to float. These voltages for the various programming states may be summarized in the following Table 1:

TABLE 1

|  | Vg | Vp | b | bx |
|---|---|---|---|---|
| Selected Cell | VPP | VPP | 0 | VPP/2 |
| Active Row/Inactive Column | VPP | VPP/2 | Float | Float |
| Inactive Row/Active Column | VPP/2 | VPP | 0 | VPP/2 |
| Inactive Row/Inactive Column | VPP/2 | VPP/2 | Float | Float |

It will be appreciated that the bit line voltages in Table 1 would be swapped should the selected cell be non-programmed rather than programmed. In other words, what is listed for bit line b would be applied to bit line bx and vice versa. Moreover, rather than ground the bit line voltage corresponding to an antifuse to be fused, an antifuse may be blown by raising the corresponding bit line voltage while lowering the voltage on the programming line Vp. In addition, it has been found that toggling the bit line corresponding to the antifuse to be programmed is advantageous in breaking down the antifuse's insulating layer. For example, rather than pull bit line b to ground, the voltage may be toggled between 0 and an intermediary voltage such as VPP/2 at a suitable frequency. In one embodiment, the bit line corresponding to the antifuse to be programmed is switched using a 50% duty cycle at 1 MHz between 0 and VPP/2 to ensure a hard breakdown of the corresponding antifuse's insulating layer.

Given this programming (or non-programming) of the memory cells, a read operation may be performed as follows. The word line corresponding to the selected memory cell(s) has its voltage (Vg) raised to a supply voltage such that the corresponding access transistors are conducting. The selected memory cells have their programming line voltage (Vp) biased to ground. Conversely, the selected memory cells' bit line pairs may be precharged to a bias voltage and then floated. The broken antifuse will then drain charge from its corresponding bitline such that a voltage difference will develop between the complementary bit lines. This voltage difference is then readily sensed by a detector such as a sense amplifier to determine the logical state of the selected memory cell. It will be appreciated that a single bit or an entire row (word) of data may be read in this fashion. Because each memory cell has its own dedicated bit line pair and programming voltage line Vp to carry the read current, there is no current crowding or IR drops such that fast read operations are enabled. Sensing a fully differential voltage also increases readout speed because the voltage development is twice as large as a single-ended memory cell.

To accommodate the programming voltage stress, access transistor 115 has a relatively thick oxide layer such as used in the I/O devices for an integrated circuit incorporating memory cell 101. The antifuses may have an insulating layer (such as gate oxide) constructed as in core devices or I/O devices. Using an insulating layer thickness corresponding to I/O devices increases the reliability of the antifuses because the likelihood of tunneling is decreased.

Figure 2:
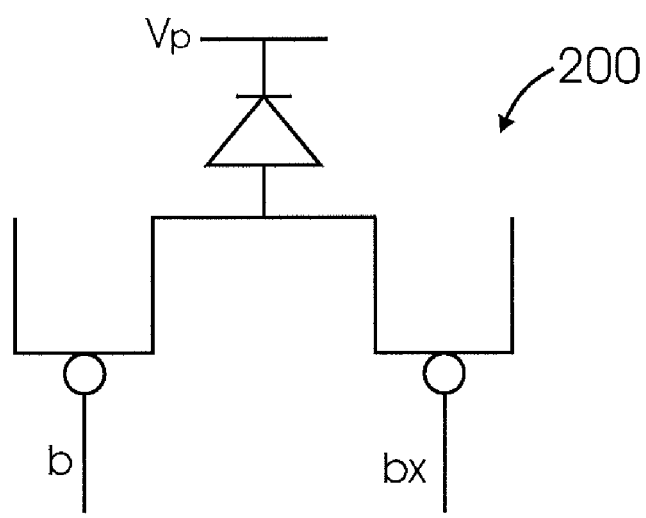
FIG. 2 is a circuit diagram of a memory cell having complementary antifuses and an access diode in accordance with an embodiment of the invention.
Figure 3:
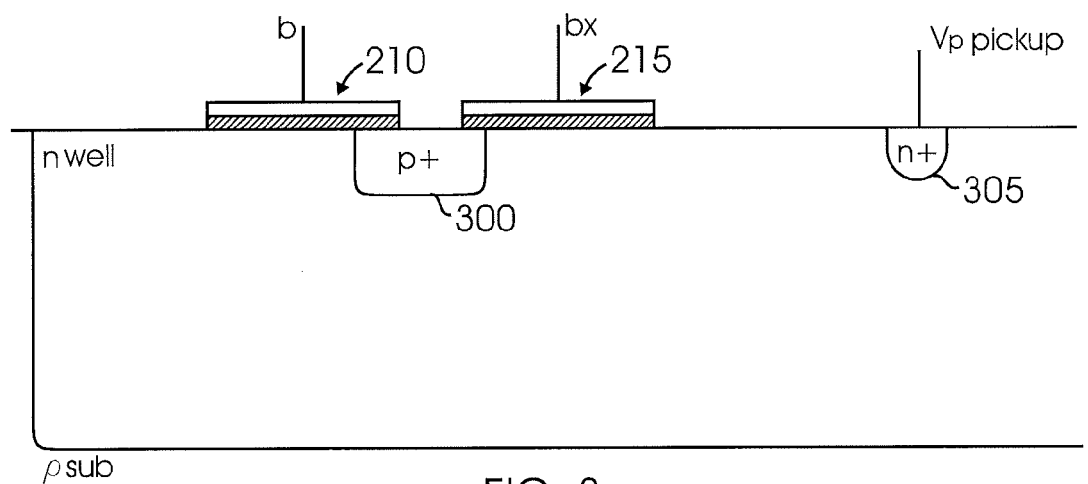
FIG. 3 is a cross-sectional view of the memory cell of FIG. 2.

Turning now to FIG. 2, a memory cell 200 is shown in which a diode 205 acts as the access device rather than an access transistor. Complementary PMOS antifuse capacitors 210 and 215 function analogously as discussed with regard to antifuses 100 and 105. As seen in a cross-section view in FIG. 3, a shared diffusion p+ doped diffusion region 300 links antifuses 210 and 215. Access diode 205 forms at the p-n junction between diffusion region 300 and a surrounding n well formed in a p– substrate. The programming voltage line Vp couples through a contact to an n+ doped diffusion region 305. For example, the programming voltage may be tapped into the n well through a strap cell that couples between clusters of bit lines. The programming line may be shunted to additional metal layers for lower resistance. As compared to memory cell 101, greater density is thus achieved through replacement of the access transistor with access diode 205. However, the programming voltage stress is reduced by the diode voltage drop across access diode 205. As discussed with regard to FIG. 1, the programming voltage may be routed horizontally in a word line fashion whereas the bit lines are routed vertically.

Should memory cell 200 be arranged in a two-dimensional array as discussed with regard to FIG. 1, the same four programming states exist. To program a selected memory cell, Vp is grounded while bit line b is charged to programming voltage VPP. Access diode 205 will thus conduct and break the insulating layer in antifuse 210. Complementary bit line bx is charged to VPP/2 to minimize the stress on memory cells in the active column but in inactive rows. The bit lines in inactive columns are allowed to float. To prevent access diode 205 for memory cells in inactive rows from conducting, the programming voltage for the inactive rows is raised to VPP. These voltages for the various programming states may be summarized in the following Table 2:

TABLE 2

|  | Vp | b | bx |
|---|---|---|---|
| Selected Cell | 0 | VPP | VPP/2 |
| Active Row/Inactive Column | 0 | Float | Float |
| Inactive Row/Active Column | VPP | VPP | VPP/2 |
| Inactive Row/Inactive Column | VPP | Float | Float |

As discussed with regard to the Table 1, the bit line (or complementary bit line if the memory cell is to be non-programmed) is preferably toggled rather than merely pulled to VPP. For example, the bit line may be switched at the same duty cycle and frequency as discussed previously. Alternatively, another voltage such as the programming voltage may be toggled to increase the likelihood of a hard breakdown of the antifuse.

Referring again to FIG. 1, it may be seen that access transistor 115 may be diode connected by deleting the vertical programming line and connecting the access transistor's drain to the corresponding word line carrying the Vg signal. However, the provision of a separate programming line for each column of memory cells as discussed with regard to memory cell 101 results in less current crowding and corresponding faster read operations.

As discussed with regard to FIG. 1, memory cell 200 may be constructed in a complementary NMOS embodiment. In such an embodiment, the programming voltages would be adjusted accordingly.

Figure 4:
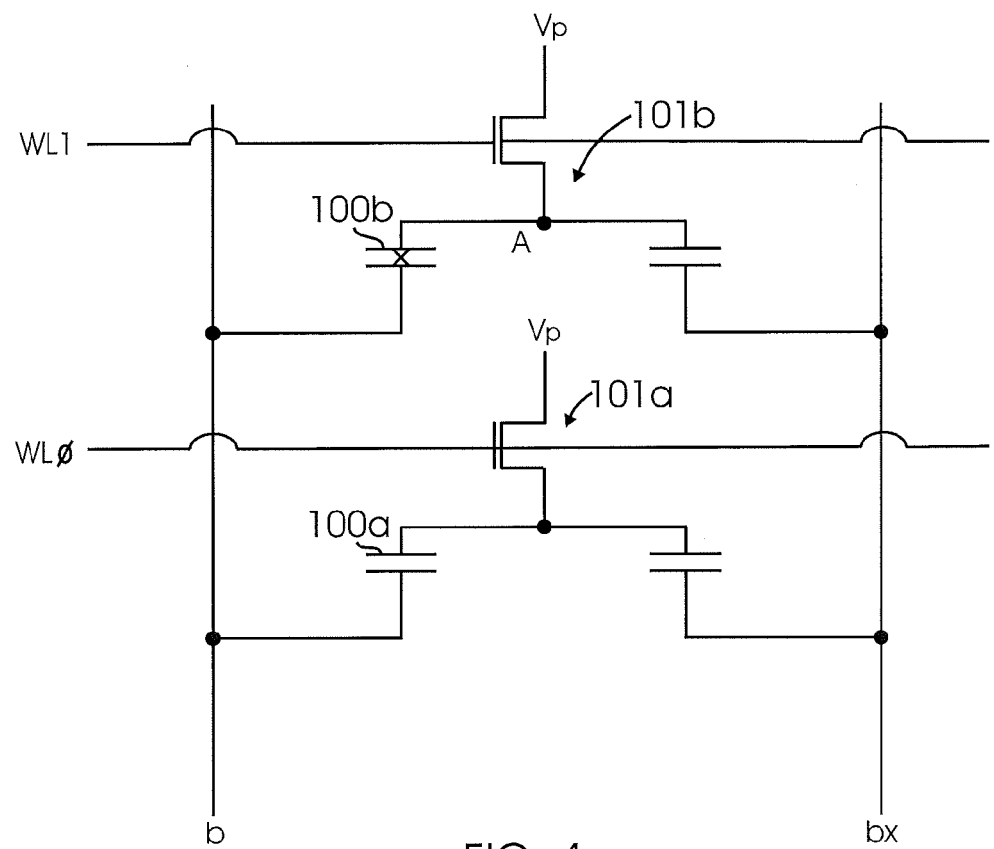
FIG. 4 is a schematic illustration of a portion of a two-dimensional array comprising the memory cells of FIG. 1.

Turning now to FIG. 4, a two-dimensional array of memory cells 101a and 101b is illustrated. Each cell 101a and 101b is constructed analogously as discussed with regard to memory cell 101 of FIG. 1. Cell 101b couples to a word line WL1 at the gate of its access transistor whereas cell 101a couples to a word line WL0. Because cells 101a and 101b are in the same column, these memory cells share bit lines b and bx. But this sharing may lead to the following effect. For example, assume that an antifuse 100b in memory cell 101b has been programmed and that a programming operation is being attempted on an antifuse 100a in memory cell 101a. As discussed with regard to Table 1, bit line bx will thus be charged to VPP/2 whereas bit line b will be grounded. However, because an antifuse 105b has not been programmed in cell 101b, the voltage VPP/2 on bit line bx will also be impressed on a node A in memory cell 101b. Because conducting antifuse 100b couples this node to bit line b, the ability to ground bit line b sufficiently so as to program cell 101a is thus hampered. It may be seen that this same issue will arise in a two-dimensional array of memory cells 200 discussed with regard to FIG. 2.

Figure 5:
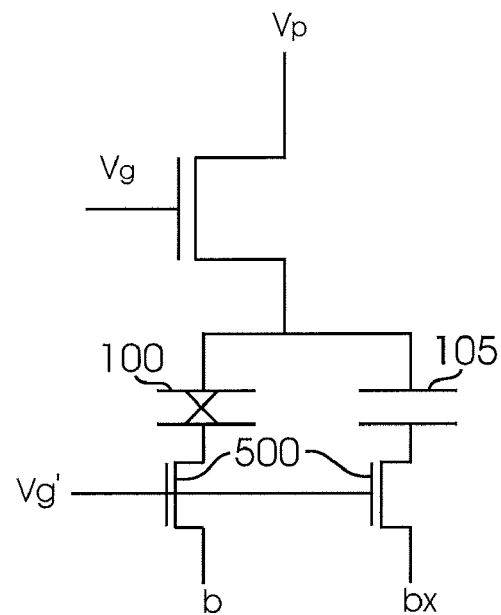
FIG. 5 is a circuit diagram of a memory cell having complementary antifuses in series with access transistors so as to reduce coupling between bit lines in accordance with an embodiment of the invention.

To better isolate the coupling through the bit lines in a column of memory cells, an access transistor 500 may be placed in series with each antifuse as shown in FIG. 5. Transistors 500 may be switched using a gating signal Vg'. The isolation between the bit lines may be shown as follows. For example, it may be assumed that antifuse 100 has been programmed. If transistors 500 are switched off (the row thereby being inactive), charge from on bit line bx cannot bleed through antifuse 100 to undesirably affect the charge on bit line b. For example, in an NMOS embodiment, an active row has its Vg' voltage raised to an intermediary voltage such as VPP/2 whereas the active row's gate voltage Vg is raised to VPP. By keeping Vg' in the inactive rows also at the intermediary voltage, the bit lines are isolated as discussed above. In an alternative embodiment, an additional access transistor may be placed in series with access transistor 115. Such an additional access transistor relieves the stress placed on access transistor 115 encountered in active rows. For example, consider a memory cell in an inactive row but active column in which antifuse 100 is conducting. If bit line b is grounded, the source of access transistor 115 will also be grounded. The full programming voltage VPP will be impressed between the source and drain to thus stress access transistor 115. If however, an additional access transistor is present and has its gate voltage Vg' grounded, access transistor 115 will not be stressed in this fashion. Both Vg and Vg' are raised to VPP for an active cell. However, such an embodiment would not provide the isolation between the bit lines discussed with regard to FIG. 5 . On the other hand, if the antifuses are assumed to possess sufficient isolation (no undue leakage) when unbroken, the extra access transistor embodiment will save die area yet have approximately the same bit error rate as provided by the embodiment of FIG. 5.

Figure 6:
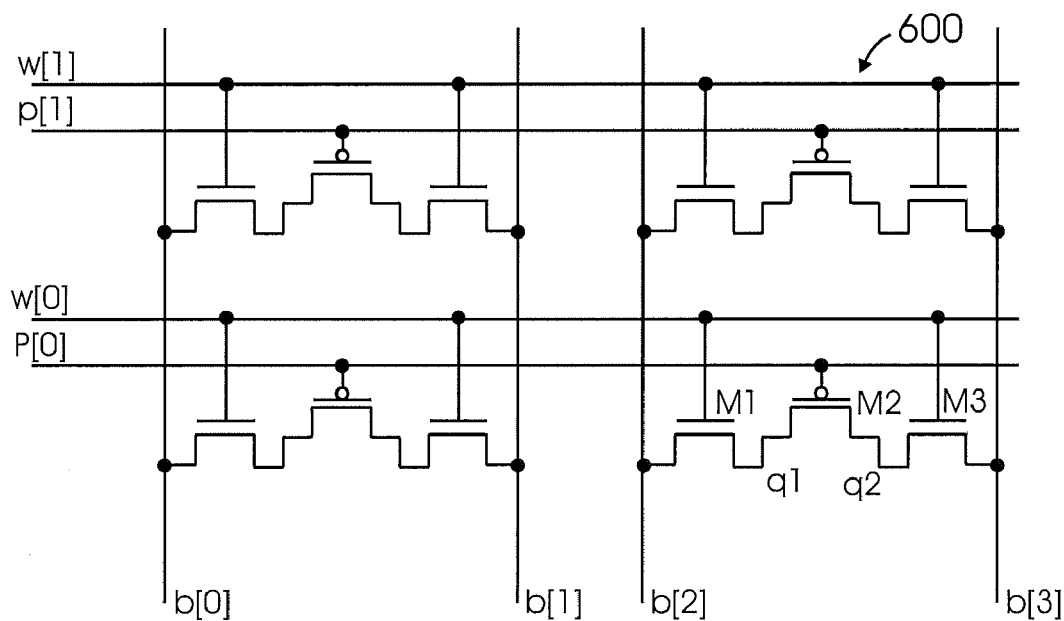
FIG. 6 illustrates a twin-bit memory cell array in accordance with an embodiment of the invention.
Figure 7A:
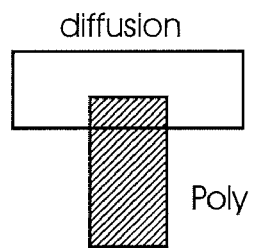
FIG. 7a illustrates a gate/diffusion region overlap having a corner defined by the gate in accordance with an embodiment of the invention.
Figure 7B:
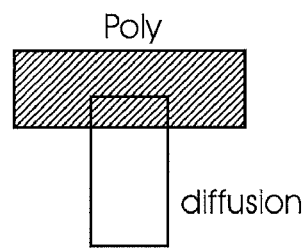
FIG. 7b illustrates a gate/diffusion region overlap having a corner defined by the diffusion layer in accordance with an embodiment of the invention.

A capacitor antifuse such as antifuses 100 and 105 in FIG. 1 has a gate (such as a polysilicon gate) that is separated from an underlying diffusion region by an insulating layer such as a gate oxide. The important breakdown mechanism for such antifuses is the diffusion region/gate overlap area. Thus, no transistor action is necessary such that the reliability of the antifuses is greatly enhanced. Because no channel need be formed, an NMOS or PMOS antifuse using a shared diffusion region such as discussed with regard to FIGS. 2 and 3 may be used to provide 2 bits of storage in that the separate gate/overlay regions may be broken down independently. A transistor antifuse may also be broken down without forming a channel. For example, turning now to FIG. 6, a PMOS antifuse memory cell array 600 includes a plurality of PMOS antifuse transistors M2. Each transistor M2 has its source/drain/gate overlap regions q1 and q2 coupled to access transistors M1 and M3, respectively. A word line controls the gates of the access transistors such that a corresponding bit line may be coupled to the source/drain region being programmed. Rather than burn the channel, the antifuse capacitor that exists between the gate overlap on the source/drain region is broken down. The gate/diffusion region overlap areas may be shaped so as to have one or more corners so that the increase fields at such discontinuities may be used advantageously to assist in the insulating layer breakdown. For example, as seen in the FIG. 7a, the gate polysilicon layer may be shaped to form one or more corners in the overlap region. Alternatively, as seen in FIG. 7b, the diffusion region may be shaped to form the overlap corners.

Referring back to FIG. 6, a programming voltage from a wordline couples to the gate of each transistor M2. It will be appreciated that a complementary NMOS embodiment may be provided in which PMOS transistors M2 are replaced with corresponding NMOS transistors. In an NMOS embodiment, a particular source/drain region is programmed by bringing the corresponding word line and programming line to the programming voltage VPP while the corresponding bit line is grounded. The remaining source/drain region is protected by raising its potential to an intermediary voltage such as VPP/2.

Figure 8:
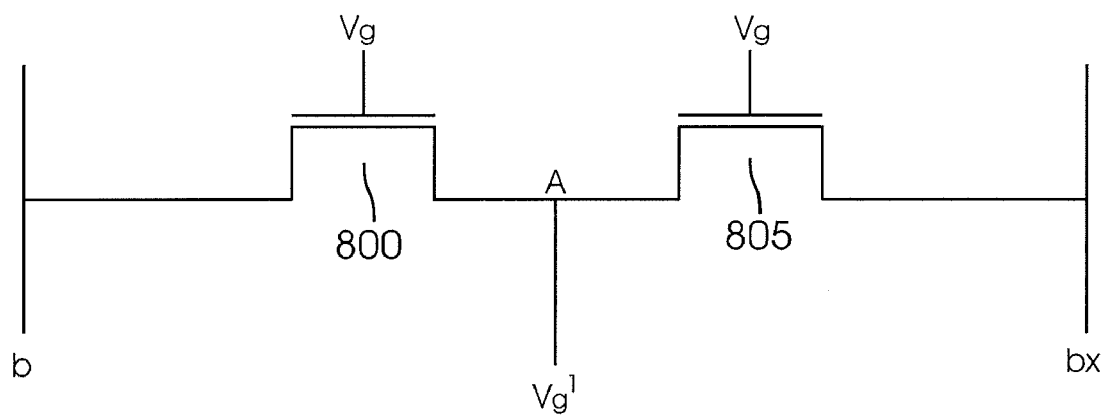
FIG. 8 is a schematic illustration of short channel transistors adapted to be programmed by altering their threshold voltages through hot channel electron effects in accordance with an embodiment of the invention.

Although the aforementioned antifuses need no formation of a channel, transistor action can be used effectively in the following fashion. It is well known that a short channel core transistor's threshold voltage shifts after being subjected to high voltage bias conditions. Hot electrons tunnel into the gate oxide and damage the short channel device, thereby causing a permanent threshold voltage shift. This effect can be advantageously exploited in either a one-dimensional or a two-dimensional OTP memory array. A core short channel device to be programmed has a large bias voltage applied such that its threshold voltage shifts. Non-programmed short channel devices do not have their threshold voltage affected in this fashion. It will be appreciated that this hot electron degradation for transistor-based antifuses may be detected in a single-ended fashion. Conversely, short channel core transistors may be arranged in complementary pairs analogously as discussed with regard to antifuses 100 and 105 such that hot electron degradation may be detected in a differential fashion. For example, a short channel transistor 800 and a short channel transistor 805 may be coupled in series between a bit line b and complementary bit line bx as seen in FIG. 8. A programming voltage Vg controls the gate of the transistors whereas a programming voltage Vg' controls a shared node A between the transistors. If voltage Vg and bit line b are both raised to VPP while voltage Vg' and bit line bx are grounded, transistor 800 will have its threshold voltage affected by the hot electrons resulting in its channel. This programming of transistor 800 may be read by setting voltages Vg and Vg' to a core voltage VDD while bit lines b and bx float. Because of the threshold change in transistor 800, bit line b and bx will have a different resulting voltage, which may be detected using a sense amplifier or other suitable detection circuit. An analogous procedure may be performed to program transistor 805.

While the disclosure has described a number of exemplary embodiments, those skilled in the arts will recognize that the invention is not limited to these exemplary embodiments but can instead be practiced with modification and alteration according to the scope of the following claims.

We claim:

1. A one-time-programmable (OTP) memory cell, comprising:
   a pair of antifuses, and
   a programming voltage access device adapted to provide a programming voltage to a first terminal for each antifuse in the pair, wherein the pair of antifuses have opposing second terminals that are adapted to couple to bit lines such that only a selected one of the antifuses in the pair is stressed by the programming voltage, a remaining one of the antifuses in the pair thereby being unstressed by the programming voltage.

2. The OTP memory cell of claim 1, wherein the programming voltage access device is a transistor.

3. The OTP memory cell of claim 1, wherein the programming voltage access device is a diode.

4. The OTP memory cell of claim 3, wherein the diode comprises a shared diffusion region between the pair of antifuses.

5. The OTP memory cell of claim 1, wherein each antifuse comprises a gate separated from an underlying diffusion region by an insulating layer.

6. The OTP memory cell of claim 5, wherein the underlying diffusion region is an n+ doped diffusion region.

7. The OTP memory cell of claim 5, wherein the underlying diffusion region is a p+ doped diffusion region.

8. A method of programming a one-time-programmable (OTP) memory cell having a pair of complementary antifuses, comprising: if a first logical state is to be stored in the memory cell, stressing a first one of the complementary antifuses while leaving a remaining second one of the complementary antifuses unstressed; and if a second logical state is to be stored in the memory cell, stressing the second one of the complementary antifuses while leaving the remaining first one of the complementary antifuses unstressed.

9. The method of claim 8, further comprising: detecting whether the first or second logical states have been stored in the memory cell by detecting a conductive difference between the two antifuses.

10. The method of claim 9, wherein detecting whether the first logical state has been stored in the memory cell comprises detecting whether the first antifuse is more conductive than the second antifuse.

11. The method of claim 9, wherein detecting whether the second logical state has been stored in the memory cell comprises detecting whether the second antifuse is more conductive than the first antifuse.

12. The method of claim 8, wherein stressing each of the first and second one of the antifuses comprises stressing each antifuse with an oscillating voltage level.

13. A array of memory cells arranged into rows and columns, the array comprising:
a plurality of bit line pairs corresponding to the columns, each bit line pair including a bit line and a complementary bit line;
a memory cell at each row and column intersection such that each memory cell corresponds uniquely to a row and a column, each memory cell having a pair of complementary antifuses, a first antifuse in the complementary pair of antifuses having a terminal directly coupled to the bit line in the corresponding column and a remaining second antifuse in the complementary pair of antifuses having a first terminal directly coupled to the complementary bit in the corresponding column; and
an access device corresponding to each memory cell, each access device directly coupling to an opposing second terminal for each antifuse in the corresponding memory cell, the access device controlling whether the opposing second terminals are coupled to a programming voltage signal.

14. The array of claim 13, wherein each access device is an access transistor.

15. The array of claim 13, wherein each access device is an access diode.

16. The array of claim 13, further comprising: an access transistor in series with each antifuse.

17. The array of claim 13, further comprising: an access transistor in series with each access device.

18. A memory array, comprising:
a plurality of antifuse transistors, each antifuse transistor having a pair of drain/source regions and a gate overlapping the drain/source regions, the gate being separated from the drain/source regions by an insulating layer, wherein each drain/source region couples to an access device such that a programming voltage may be applied to a selected one of the drain/source regions to stress a portion of the insulating layer while a remaining portion of the insulating layer that separates a remaining one of the source/drain regions is not stressed.

19. The memory array of claim 18, wherein each drain/source region is an n+doped diffusion region.

20. The memory array of claim 18, wherein each drain/source region is a p+doped diffusion region.

* * * * *